United States Patent
Schubert et al.

(10) Patent No.: US 7,819,557 B2
(45) Date of Patent: Oct. 26, 2010

(54) ENCAPSULANT SHAPES FOR LIGHT EMITTING DEVICES LACKING ROTATIONAL SYMMETRY DESIGNED TO ENHANCE EXTRACTION OF LIGHT WITH A PARTICULAR LINEAR POLARIZATION

(75) Inventors: Martin F. Schubert, Troy, NY (US); Ahmed Noemaun, Troy, NY (US); Sameer Chhajed, Troy, NY (US); Jong Kyu Kim, Watervliet, NY (US); E. Fred Schubert, Troy, NY (US); Cheolsoo Sone, Suwon-si (KR)

(73) Assignees: Rensselaer Polytechnic Institute, Troy, NY (US); Samsung Electro-Mechanics Co., Ltd., Suwon (KR)

( * ) Notice: Subject to any disclaimer, the term of this patent is extended or adjusted under 35 U.S.C. 154(b) by 305 days.

(21) Appl. No.: 12/213,790

(22) Filed: Jun. 24, 2008

(65) Prior Publication Data

US 2009/0080217 A1  Mar. 26, 2009

Related U.S. Application Data

(60) Provisional application No. 60/945,977, filed on Jun. 25, 2007.

(51) Int. Cl.
*F21V 3/00* (2006.01)
*F21V 5/00* (2006.01)

(52) U.S. Cl. .................. 362/311.02; 362/19; 362/255; 362/293; 362/311.06; 257/100

(58) Field of Classification Search ................ 362/19, 362/255, 293, 311.02, 311.06; 257/100
See application file for complete search history.

(56) References Cited

U.S. PATENT DOCUMENTS

| 7,408,201 | B2 * | 8/2008 | Keuper et al. ................ 257/98 |
| 2006/0083000 | A1 * | 4/2006 | Yoon et al. ................... 362/311 |
| 2008/0316751 | A1 * | 12/2008 | Schubert et al. ............. 362/296 |

* cited by examiner

*Primary Examiner*—Stephen F Husar
*Assistant Examiner*—James W Cranson

(57) ABSTRACT

The light-emitting device includes a light source and a transparent encapsulating material that is shaped to modify the polarization anisotropy of light emitted by the light source in at least one direction.

9 Claims, 5 Drawing Sheets

ENCAPSULANT SHAPES FOR LIGHT EMITTING DEVICES LACKING ROTATIONAL SYMMETRY DESIGNED TO ENHANCE EXTRACTION OF LIGHT WITH A PARTICULAR LINEAR POLARIZATION

CROSS-REFERENCE TO RELATED APPLICATIONS

This application claims the benefit of U.S. Provisional Application No. 60/945,977, filed Jun. 25, 2007, the disclosure of which is incorporated herein by reference.

BACKGROUND

1. Field

The present invention relates generally to encapsulant shapes for light emitting devices and specifically to a shape designed to maximize linear polarization.

2. Description of the Related Art

Polarized light sources are highly desirable for numerous applications including liquid crystal display (LCD) backlighting, illumination for polarization microscopy, reduction of headlight glare in automobiles, and for noise reduction in free-space optical communications. Generally, in these applications, a single linear polarization is desired, and the orthogonal polarization may be considered non-desirable. However, semiconductor light emitting diodes (LEDs), which are attractive for many of these applications, are generally considered to be unpolarized sources. In addition, the encapsulant shapes typically used for LEDs are rotationally symmetric, which results in equal output for the desired polarization and undesired polarization. Accordingly, an encapsulant shape used for an LED or any other light source that can increase extraction of a particular linear polarization is needed.

SUMMARY

The light-emitting device includes a light source and a transparent encapsulating material that is shaped to modify the polarization anisotropy of light emitted by the light source in at least one direction.

In the light-emitting device the polarization anisotropy of light emitted in at least one direction may be increased.

In the light-emitting device the polarization anisotropy of light emitted in at least one direction may be decreased.

In the light-emitting device the cumulative effect of modified polarization anisotropy may be that for all emitted light, the total component of light polarization along a particular direction has greater magnitude than components orthogonal to this direction.

In the light-emitting device the cumulative effect of modified polarization anisotropy may be that for all emitted light, the total component of light polarization lying in a particular plane has greater magnitude than the components lying in orthogonal planes.

In the light-emitting device the light source may be a semiconductor light-emitting diode chip.

In the light-emitting device the light source may be one of a plurality of light sources arranged within the encapsulation.

The light-emitting device may also include a phosphor above light source.

In the light-emitting device the encapsulating material may be a polymer.

The encapsulant for a light emitting device, such as a light emitting diode (LED), has a geometrical shape that enhances the extraction of a particular linear polarization. The encapsulant shape takes advantage of the low reflection coefficient at an interface for transverse magnetic (TM) polarized light incident near the Brewster angle. This concept can be realized with more than one distinct encapsulant shape design. One common characteristic for all designs is the lack of rotational symmetry. Rotational symmetry is typically a property of conventional encapsulants for LEDs commercially available at the present time. In addition, the encapsulant is shaped so that the angle formed between the normal to the encapsulant surface and a light ray originating from the light emitting device is approximately equal to the Brewster angle for some fraction of rays which lie within at least one plane that also contains the light emitting device.

Additional aspects and/or advantages will be set forth in part in the description which follows and, in part, will be apparent from the description, or may be learned by practice of the invention.

BRIEF DESCRIPTION OF THE DRAWINGS

These and/or other aspects and advantages will become apparent and more readily appreciated from the following description of the embodiments, taken in conjunction with the accompanying drawings of which.

DETAILED DESCRIPTION OF EMBODIMENTS

In the following detailed description of various embodiments, reference is made to the accompanying drawings that form a part hereof, and in which are shown by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that compositional, structural, and logical substitutions and changes may be made without departing from the scope of this disclosure. Examples and embodiments merely typify possible variations. Individual components and functions are optional unless explicitly required, and the sequence of operations may vary. Portions and features of some embodiments may be included in or substituted for those of others. The following description is, therefore, not to be taken in a limiting sense.

Figure 1:
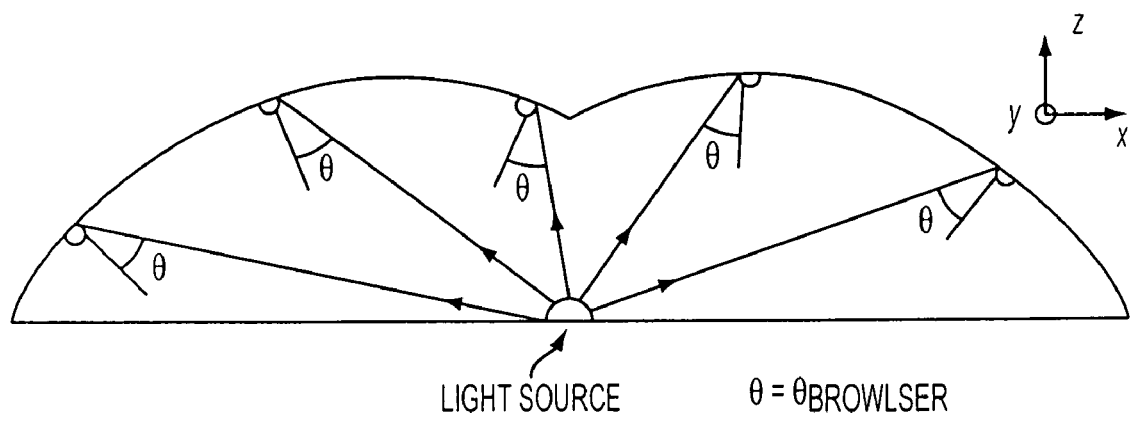
FIG. 1 is a cross sectional view of an encapsulant shape which enhances xtraction of a light polarized in the xz-plane.

The concept of the encapsulant shape is to take advantage of the low reflection coefficient near the Brewster angle for transverse magnetic (TM) polarized light. The cross section of the optimized shape is easy to visualize. Consider a light source embedded in an encapsulant with a cross section as shown in FIG. 1. For any ray that can be drawn from the light source to the surface of the encapsulant, the angle between the incident ray and the normal to the surface is the Brewster angle. Light which is polarized within the xz-plane is TM with regard to the surface and does not experience reflection when it strikes the interface because it is incident at the Brewster angle $\Theta_B$. Any other shape for the encapsulant will result in reflections for xz-polarized light and lower extraction efficiency. Light polarized in the y-direction is transverse-electric (TE) with regard to the surface, and does undergo some reflection at the interface. Therefore, the shaped encapsulant increases the extraction efficiency for a particular linear polarization when compared to a conventional encapsulant. As a result, light leaving the encapsulant will be partially polarized even when the light source itself is completely unpolarized.

Figure 2:
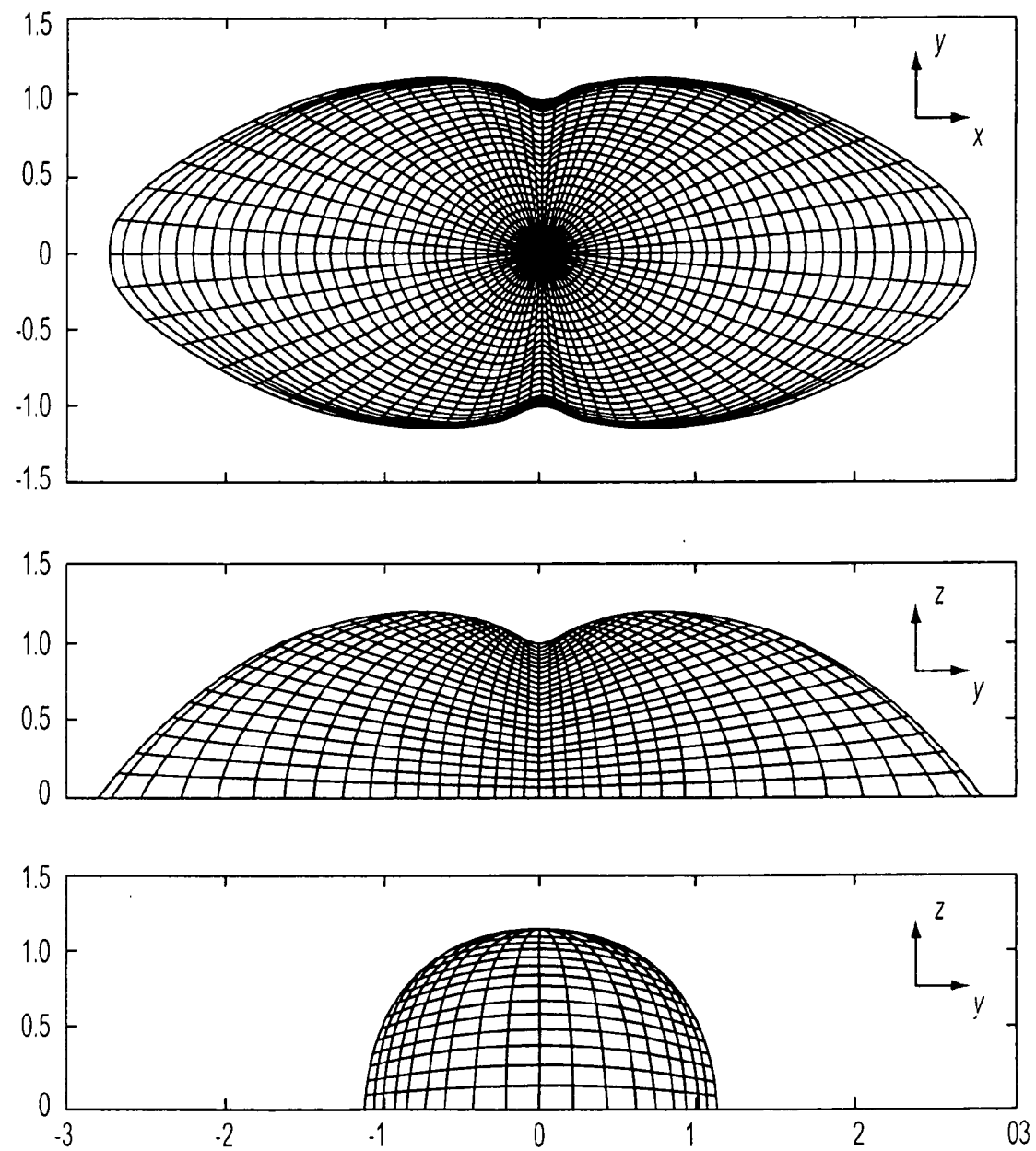
FIG. 2 is a wireframe view of the polarization-enhancing encapsulant shape.

In one embodiment of the present invention the three dimensional optimized structure is numerically determined as follows. An unpolarized, isotropic point-like light source is assumed to be located at the origin. The point source approximation is valid as long as the surface area of the emitter is small compared to the dimensions of the encapsulant. Because of symmetry, it is sufficient to calculate only one quarter of the encapsulant structure. The encapsulant surface is defined in terms of a rectangular grid of points in spherical coordinates in which the azimuthal angle $\Theta$ and zenith angle $\phi$ for each point are fixed and spaced at regular intervals. The radial coordinate r is initially unknown. For the point directly above the light source, r is set equal to the unit length. A single line of points on the mesh for which $\Theta$ is fixed is now calculated. For each point on this line other than the one where $\phi=0$, two new points $(\Theta+\Delta\Theta, \phi)$ and $(\Theta-\Delta\Theta, \phi)$ are considered. A triangle can be formed between the $\phi=0$ point and the two new points with adjacent $\phi$ value. The calculation now considers an unpolarized beam which travels through the center of the three rays formed between the origin and the three triangle vertexes. The pair of r-values which maximizes transmission of this beam through a linear polarizer that lies in the xy-plane and allows light polarized in the x-direction to pass is found. Once r has been found for these two points, it is possible to form four distinct triangles between the two points with newly found r and the two points with the next $\phi$ value. The pair of r-values which simultaneously maximize transmission through the linear polarizer for beams traveling through the center of each of the four triangles is then found. This process continues until all the points on the line have been found. The values for r for the points $(\Theta, \phi)$ on the line are then found by averaging r for the points $(\Theta+\Delta\Theta, \phi)$ and $(\Theta-\Delta\Theta, \phi)$. This process is repeated until all the points on the mesh have been calculated. The entire encapsulant shape is formed by appropriately rotating and reflecting the known quarter structure. A wireframe view of the optimized encapsulant shape is shown in FIG. 2.

Calculations to determine the effectiveness of the encapsulant shape were performed using LightTools optical engineering software, which uses ray tracing with full optical accuracy to simulate optical systems. In the simulations, the single point source was placed in the middle of the encapsulant at the base. The bottom of the encapsulant was covered with an absorber to minimize the effect of beams which undergo multiple reflections. The figure of merit used to determine the effectiveness of the encapsulant is the polarization ratio $R_P$, which is defined as $R_P=P_x/P_y$ (Equation 1) where $P_x$ and $P_y$ are the total optical powers which are transmitted through a polarizer lying parallel to the xy-plane above the encapsulant which allows light polarized in the x-direction and y-direction, respectively, to pass. LightTools simulation results predict an overall enhancement in the polarization ratio of 8.3% for the optimized encapsulant with refractive index n=1.5. When the same structure is simulated with n=1.6, the enhancement is 14.1%. The higher value for $R_P$ is due to the increase in reflection for TE polarized light near the Brewster angle with increasing refractive index.

Figure 3:
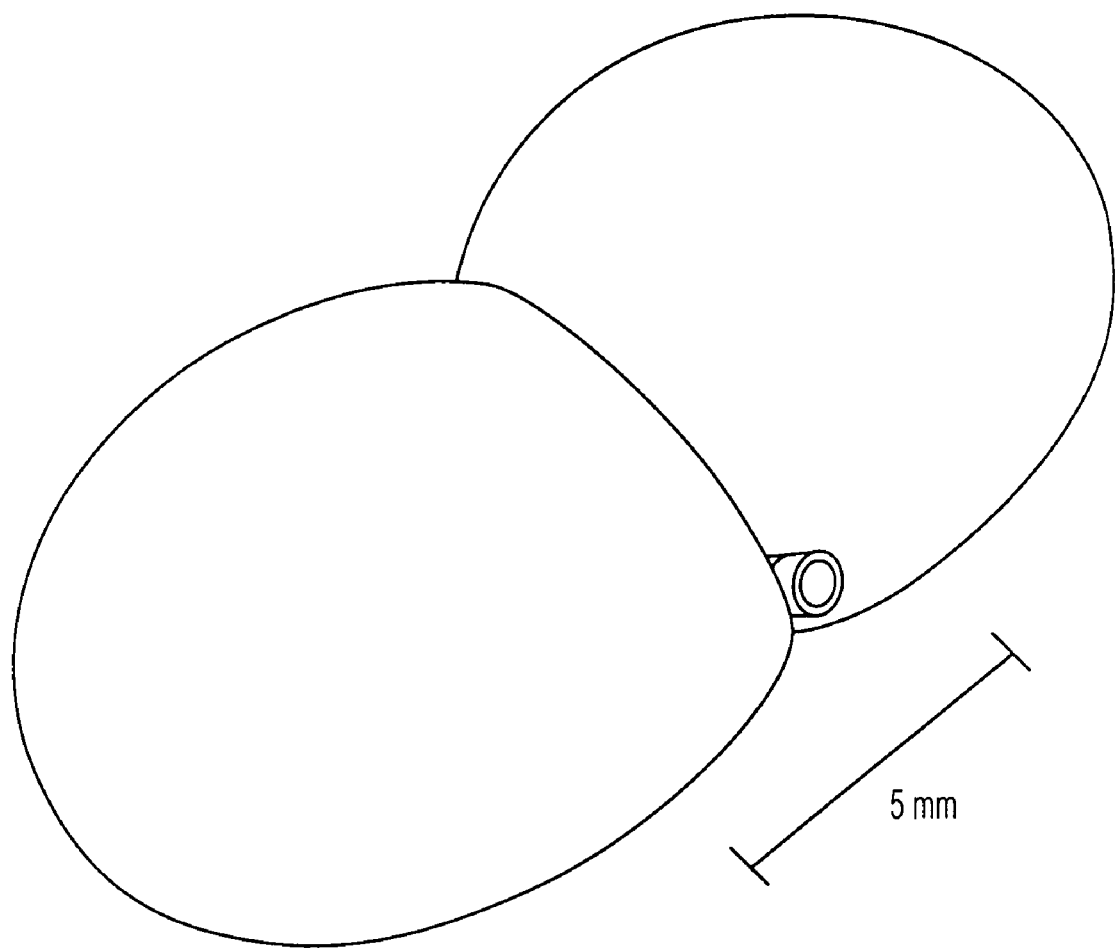
FIG. 3 is a perspective view of a polarization-enhancing encapsulant shape.

The encapsulant shape is experimentally realized by fabricating an aluminum mold with a computer controlled milling machine and then extensively polishing the mold to achieve a specular optical surface. A two-component epoxy intended for optics applications is poured into the mold and then cured at 120° C. for 2 hours. FIG. 3 shows a photograph of the fabricated encapsulant shape. For experimental measurements, the light source is formed by a mixture of yellow phosphor and epoxy that is embedded in the center of the bottom side of the encapsulant and is optically excited by a high power blue LED. The LED-excited phosphor is selected as a source because it allows simple index matching between the source and encapsulant, and because the light emitted by the phosphor is completely random in polarization. Using an unpolarized phosphor source rather than, for example, an LED—which may have some subtle polarization effects—simplifies verification that the encapsulant shape is working as intended.

Figure 4:
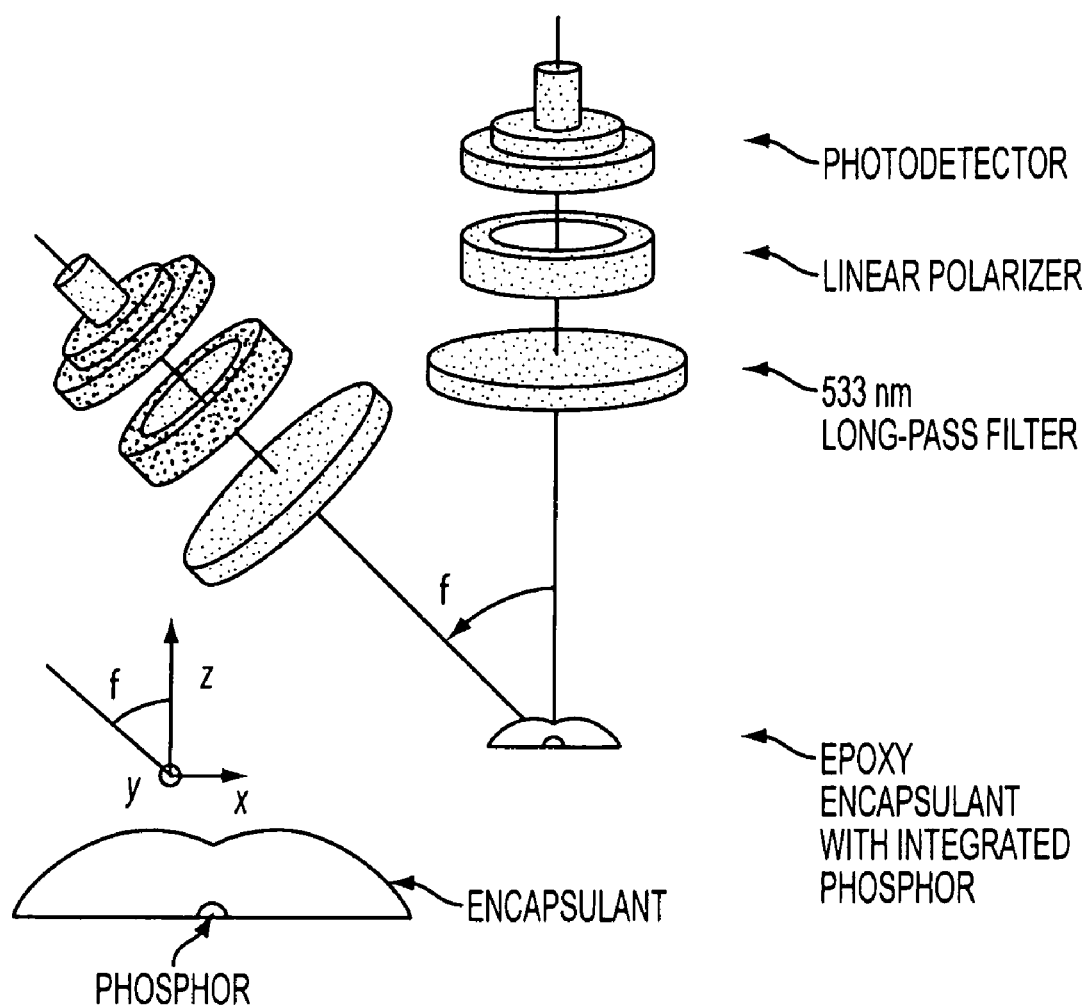
FIG. 4 is a plan view of the setup used for measuring the polarization-enhancing encapsulant.

A schematic of the measurement setup is shown in FIG. 4. The encapsulant with embedded phosphor is located at the axis of rotation for an arm which holds a 533 nm 15 filter, linear polarizer, and photodetector. The arm can be rotated about the encapsulant to measure the intensity as a function of the zenith angle $\phi$. The backside of the encapsulant is masked with the exception of a small square less than 0.5 mm wide so as to reveal only the phosphor; together with the 533 nm filter, this ensures that only light generated by the phosphor is measured. The mask also serves to eliminate multiple reflections inside the encapsulant, which aligns the experimental setup with the simulations performed in LightTools and should give better agreement with calculated predictions. However, in practice it would be desirable to introduce a reflector at the base. For example, if a diffuse reflector is used, then light with the non-desirable polarization—which has a stronger initial reflection—will be randomized in polarization and direction when it strikes the reflector, and will contribute to the intensity of the desired polarization at the output.

Figure 5:
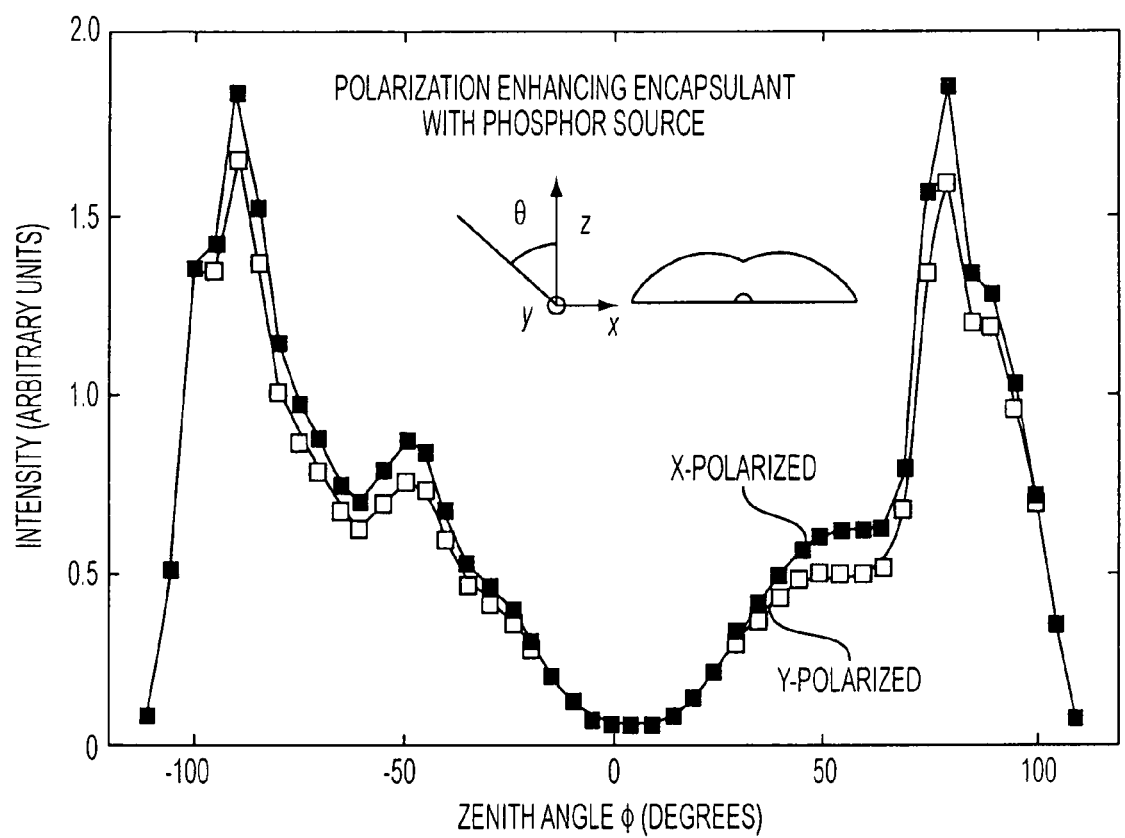
FIG. 5 is a graph showing the intensity of light passing through a polarizer aligned in the x-direction and y-direction as a function of the zenith angle $\phi$.

FIG. 4 shows the measured intensity as a function of the angle when the polarizer is oriented in the x-direction and when the polarizer is oriented in the y-direction. The intensity is low for $\phi=0$ and becomes larger as the magnitude of $\Theta$ increases. This is because the encapsulant also acts as a lens which focuses the light produced by the phosphor in specific directions. The intensity of x-polarized light is consistently higher than that of y-polarized light throughout the range of angles measured. FIG. 5 shows the ratio of the two intensities as a function of angle and provides a comparison with the numerically simulated result. The measured ratio is greater than unity for all angles other than those close to $\phi=0$, where the actual intensity is very low. For angles where the intensity is higher, the polarization ratio becomes larger than unity. The shape of the measured curve agrees well with the theoretical result from LightTools. However, the peak measured value is approximately 1.28, which is higher than the peak calculated value. This difference can be attributed to a discrepancy between the actual epoxy refractive index and the refractive index used in the calculations. As mentioned earlier, an increase in refractive index results in a larger polarization ratio for the same geometrical structure.

In conclusion, a non-rotationally symmetric encapsulant shape has been shown to enhance the extraction of a particular linear polarization from an unpolarized source by both numerical ray tracing simulations and experimental measurements. The encapsulant shape takes advantage of the low reflection coefficient for TM polarized light at the Brewster angle and results in an overall theoretical enhancement of 8.3% when the refractive index is 1.5. The measured enhancement is somewhat larger than the simulated result.

Although a few embodiments have been shown and described, it would be appreciated by those skilled in the art that changes may be made in these embodiments without departing from the principles and spirit of the invention, the scope of which is defined in the claims and their equivalents.

What is claimed is:

1. A light-emitting device, comprising:
   a light source; and
   a transparent encapsulating material that is shaped to modify polarization anisotropy of light emitted by the light source in at least one direction.

2. The device in claim 1, wherein the polarization anisotropy of light emitted in at least one direction is increased.

3. The device in claim 1, wherein the polarization anisotropy of light emitted in at least one direction is decreased.

4. The device in claim 1, wherein the cumulative effect of modified polarization anisotropy is such that for all emitted light, the total component of light polarization along a particular direction has greater magnitude than components orthogonal to this direction.

5. The device in claim 1, wherein the cumulative effect of modified polarization anisotropy is such that for all emitted light, the total component of light polarization lying in a particular plane has greater magnitude than the components lying in orthogonal planes.

6. The device in claim 1, wherein the light source is a semiconductor light-emitting diode chip.

7. The device in claim 1, wherein the light source is one of a plurality of light sources arranged within the encapsulating material.

8. The device of claim 1, further comprising a phosphor above the light source.

9. The device of claim 1, wherein the encapsulating material is a polymer.

* * * * *